US012081248B2

(12) United States Patent
Abotabl et al.

(10) Patent No.: US 12,081,248 B2
(45) Date of Patent: Sep. 3, 2024

(54) DIRECTIONAL DIGITAL PRE-DISTORTION FOR INTER USER EQUIPMENT INTERFERENCE MITIGATION

(71) Applicant: QUALCOMM Incorporated, San Diego, CA (US)

(72) Inventors: Ahmed Attia Abotabl, San Diego, CA (US); Abdelrahman Mohamed Ahmed Mohamed Ibrahim, San Diego, CA (US); Muhammad Sayed Khairy Abdelghaffar, San Jose, CA (US); Krishna Kiran Mukkavilli, San Diego, CA (US); Tingfang Ji, San Diego, CA (US); Joseph Patrick Burke, San Diego, CA (US); Renqiu Wang, San Diego, CA (US); Hwan Joon Kwon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/451,956

(22) Filed: Oct. 22, 2021

(65) Prior Publication Data

US 2023/0130805 A1  Apr. 27, 2023

(51) Int. Cl.
*H04B 1/04* (2006.01)
*H03F 1/32* (2006.01)

(52) U.S. Cl.
CPC ......... *H04B 1/0475* (2013.01); *H03F 1/3247* (2013.01); *H03F 1/3282* (2013.01); *H03F 2200/451* (2013.01); *H04B 2001/0425* (2013.01)

(58) Field of Classification Search
CPC .......... H04B 1/0475; H04B 2001/0425; H03F 1/3247; H03F 1/3282; H03F 2200/451
USPC .......................................................... 375/262
See application file for complete search history.

(56) References Cited

U.S. PATENT DOCUMENTS

| 2006/0078065 | A1* | 4/2006 | Cai ................... H04L 25/03885 |
| | | | 375/297 |
| 2018/0026683 | A1* | 1/2018 | Manholm ............ H04B 7/0695 |
| | | | 375/267 |
| 2018/0076847 | A1* | 3/2018 | Ju ........................ H04L 25/0224 |
| 2019/0074854 | A1* | 3/2019 | Raghavan ............ H04B 1/3838 |
| 2019/0089389 | A1* | 3/2019 | Gutman .................... H03F 3/24 |
| 2020/0252032 | A1* | 8/2020 | Faig ....................... H03F 1/3276 |
| 2020/0275458 | A1* | 8/2020 | Khoryaev ............... H04W 4/46 |

(Continued)

OTHER PUBLICATIONS

E. Ng, Y. Beltagy, G. Scarlato, A. Ben Ayed, P. Mitran and S. Boumaiza, "Digital Predistortion of Millimeter-Wave RF Beamforming Arrays Using Low Number of Steering Angle-Dependent Coefficient Sets," in IEEE Transactions on Microwave Theory and Techniques, vol. 67, No. 11, pp. 4479-4492, Nov. 2019, doi: 10.1109/TMTT.2019.2924893.

*Primary Examiner* — Kevin M Burd
(74) *Attorney, Agent, or Firm* — Harrity & Harrity, LLP

(57) ABSTRACT

Various aspects of the present disclosure generally relate to wireless communication. In some aspects, a user equipment (UE) may receive a configuration indicating one or more directions for applying directional digital pre-distortion (DPD) to mitigate interference in a direction to another UE. The UE may transmit a communication to a wireless node based at least in part on applying the directional DPD according to the configuration. Numerous other aspects are described.

30 Claims, 9 Drawing Sheets

(56) References Cited

U.S. PATENT DOCUMENTS

2020/0364187 A1\* 11/2020 Tran ................... H04B 7/0413
2022/0021349 A1\* 1/2022 Yan ......................... H03F 3/21

\* cited by examiner

DIRECTIONAL DIGITAL PRE-DISTORTION FOR INTER USER EQUIPMENT INTERFERENCE MITIGATION

FIELD OF THE DISCLOSURE

Aspects of the present disclosure generally relate to wireless communication and to techniques and apparatuses for directional digital pre-distortion (DPD) for inter user equipment (UE) interference mitigation.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include one or more base stations that support communication for a user equipment (UE) or multiple UEs. A UE may communicate with a base station via downlink communications and uplink communications. "Downlink" (or "DL") refers to a communication link from the base station to the UE, and "uplink" (or "UL") refers to a communication link from the UE to the base station.

The above multiple access technologies have been adopted in various telecommunication standards to provide a common protocol that enables different UEs to communicate on a municipal, national, regional, and/or global level. New Radio (NR), which may be referred to as 5G, is a set of enhancements to the LTE mobile standard promulgated by the 3GPP. NR is designed to better support mobile broadband internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink, using CP-OFDM and/or single-carrier frequency division multiplexing (SC-FDM) (also known as discrete Fourier transform spread OFDM (DFT-s-OFDM)) on the uplink, as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

Some aspects described herein relate to a method of wireless communication performed by a user equipment (UE). The method may include receiving a configuration indicating one or more directions for applying directional digital pre-distortion (DPD) to mitigate interference in a direction to another UE. The method may include transmitting a communication to a wireless node based at least in part on applying the directional DPD according to the configuration.

Some aspects described herein relate to a method of wireless communication performed by a base station. The method may include transmitting, to a first UE, a configuration indicating one or more directions for applying directional DPD to mitigate interference in a direction to a second UE. The method may include receiving, from the first UE and via a main uplink beam, a communication based at least in part on the first UE applying the directional DPD according to the configuration.

Some aspects described herein relate to a UE for wireless communication. The UE may include a memory and one or more processors coupled to the memory. The one or more processors may be configured to receive a configuration indicating one or more directions for applying directional DPD to mitigate interference in a direction to another UE. The one or more processors may be configured to transmit a communication to a wireless node based at least in part on applying the directional DPD according to the configuration.

Some aspects described herein relate to a base station for wireless communication. The base station may include a memory and one or more processors coupled to the memory. The one or more processors may be configured to transmit, to a first UE, a configuration indicating one or more directions for applying DPD to mitigate interference in a direction to a second UE. The one or more processors may be configured to receive, from the first UE and via a main uplink beam, a communication based at least in part on the first UE applying the directional DPD according to the configuration.

Some aspects described herein relate to a non-transitory computer-readable medium that stores a set of instructions for wireless communication by a UE. The set of instructions, when executed by one or more processors of the UE, may cause the UE to receive a configuration indicating one or more directions for applying directional DPD to mitigate interference in a direction to another UE. The set of instructions, when executed by one or more processors of the UE, may cause the UE to transmit a communication to a wireless node based at least in part on applying the directional DPD according to the configuration.

Some aspects described herein relate to a non-transitory computer-readable medium that stores a set of instructions for wireless communication by a base station. The set of instructions, when executed by one or more processors of the base station, may cause the base station to transmit, to a first UE, a configuration indicating one or more directions for applying directional DPD to mitigate interference in a direction to a second UE. The set of instructions, when executed by one or more processors of the base station, may cause the base station to receive, from the first UE and via a main uplink beam, a communication based at least in part on the first UE applying the directional DPD according to the configuration.

Some aspects described herein relate to an apparatus for wireless communication. The apparatus may include means for receiving a configuration indicating one or more directions for applying directional DPD to mitigate interference in a direction to a UE. The apparatus may include means for transmitting a communication to a wireless node based at least in part on applying the directional DPD according to the configuration.

Some aspects described herein relate to an apparatus for wireless communication. The apparatus may include means for transmitting, to a first UE, a configuration indicating one or more directions for applying directional DPD to mitigate interference in a direction to a second UE. The apparatus may include means for receiving, from the first UE and via a main uplink beam, a communication based at least in part on the first UE applying the directional DPD according to the configuration.

Aspects generally include a method, apparatus, system, computer program product, non-transitory computer-readable medium, user equipment, base station, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages, will be better understood from the following description when considered in connection with the accompanying figures. Each of the figures is provided for the purposes of illustration and description, and not as a definition of the limits of the claims.

While aspects are described in the present disclosure by illustration to some examples, those skilled in the art will understand that such aspects may be implemented in many different arrangements and scenarios. Techniques described herein may be implemented using different platform types, devices, systems, shapes, sizes, and/or packaging arrangements. For example, some aspects may be implemented via integrated chip embodiments or other non-module-component based devices (e.g., end-user devices, vehicles, communication devices, computing devices, industrial equipment, retail/purchasing devices, medical devices, and/or artificial intelligence devices). Aspects may be implemented in chip-level components, modular components, non-modular components, non-chip-level components, device-level components, and/or system-level components. Devices incorporating described aspects and features may include additional components and features for implementation and practice of claimed and described aspects. For example, transmission and reception of wireless signals may include one or more components for analog and digital purposes (e.g., hardware components including antennas, radio frequency (RF) chains, power amplifiers, modulators, buffers, processors, interleavers, adders, and/or summers). It is intended that aspects described herein may be practiced in a wide variety of devices, components, systems, distributed arrangements, and/or end-user devices of varying size, shape, and constitution.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. One skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

While aspects may be described herein using terminology commonly associated with a 5G or New Radio (NR) radio access technology (RAT), aspects of the present disclosure can be applied to other RATs, such as a 3G RAT, a 4G RAT, and/or a RAT subsequent to 5G (e.g., 6G).

Figure 1:
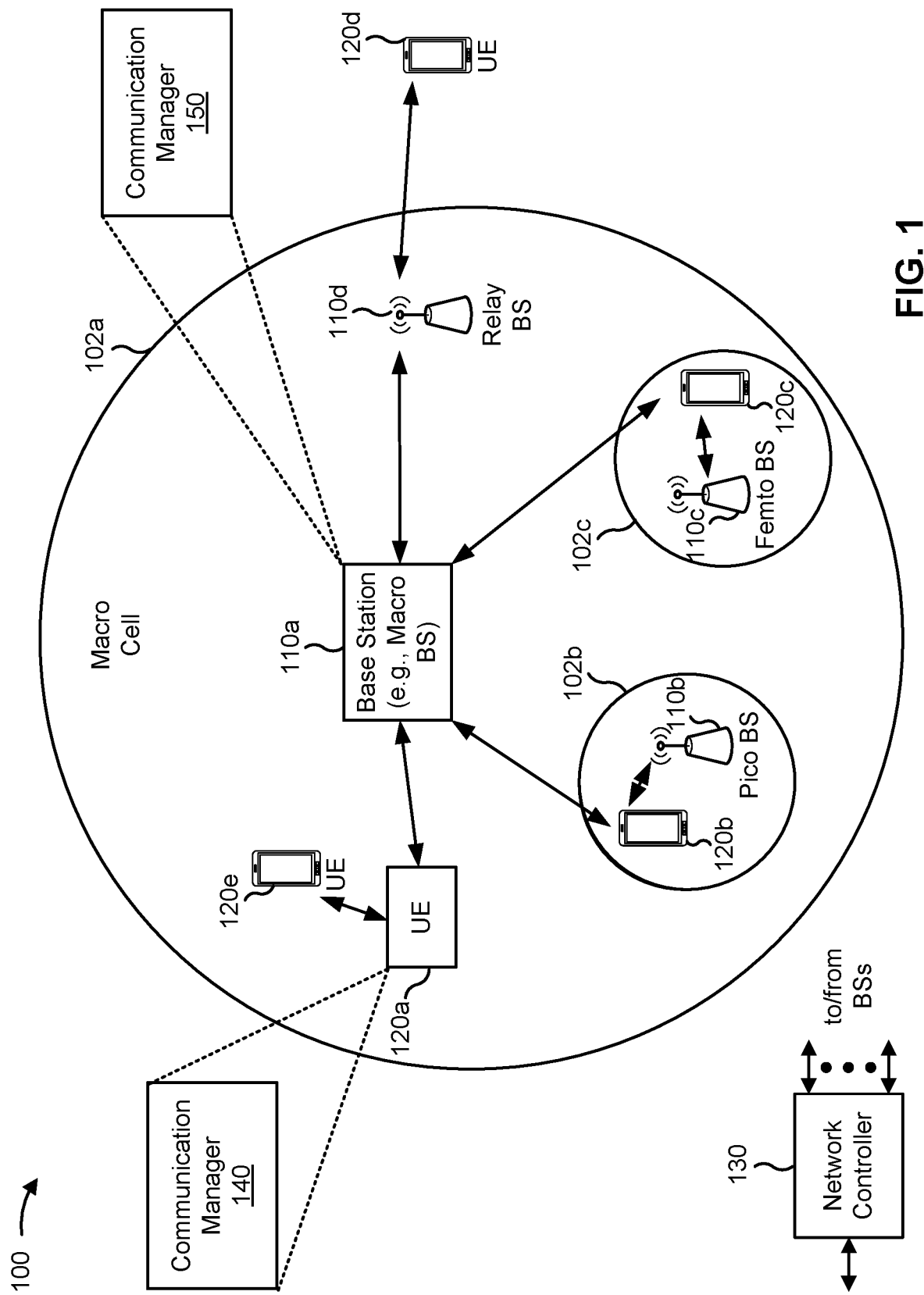
FIG. 1 is a diagram illustrating an example of a wireless network, in accordance with the present disclosure.

FIG. 1 is a diagram illustrating an example of a wireless network 100, in accordance with the present disclosure. The wireless network 100 may be or may include elements of a 5G (e.g., NR) network and/or a 4G (e.g., Long Term Evolution (LTE)) network, among other examples. The wireless network 100 may include one or more base stations 110 (shown as a BS 110a, a BS 110b, a BS 110c, and a BS 110d), a user equipment (UE) 120 or multiple UEs 120 (shown as a UE 120a, a UE 120b, a UE 120c, a UE 120d, and a UE 120e), and/or other network entities. A base station 110 is an entity that communicates with UEs 120. A base station 110 (sometimes referred to as a BS) may include, for example, an NR base station, an LTE base station, a Node B, an eNB (e.g., in 4G), a gNB (e.g., in 5G), an access point, and/or a transmission reception point (TRP). Each base station 110 may provide communication coverage for a particular geographic area. In the Third Generation Partnership Project (3GPP), the term "cell" can refer to a coverage area of a base station 110 and/or a base station subsystem serving this coverage area, depending on the context in which the term is used.

A base station 110 may provide communication coverage for a macro cell, a pico cell, a femto cell, and/or another type of cell. A macro cell may cover a relatively large geographic area (e.g., several kilometers in radius) and may allow unrestricted access by UEs 120 with service subscriptions. A pico cell may cover a relatively small geographic area and may allow unrestricted access by UEs 120 with service subscription. A femto cell may cover a relatively small geographic area (e.g., a home) and may allow restricted access by UEs 120 having association with the femto cell (e.g., UEs 120 in a closed subscriber group (CSG)). A base station 110 for a macro cell may be referred to as a macro base station. A base station 110 for a pico cell may be referred to as a pico base station. A base station 110 for a femto cell may be referred to as a femto base station or an in-home base station. In the example shown in FIG. 1, the BS 110a may be a macro base station for a macro cell 102a, the BS 110b may be a pico base station for a pico cell 102b, and the BS 110c may be a femto base station for a femto cell 102c. A base station may support one or multiple (e.g., three) cells.

In some examples, a cell may not necessarily be stationary, and the geographic area of the cell may move according to the location of a base station 110 that is mobile (e.g., a mobile base station). In some examples, the base stations 110 may be interconnected to one another and/or to one or more other base stations 110 or network nodes (not shown) in the wireless network 100 through various types of backhaul interfaces, such as a direct physical connection or a virtual network, using any suitable transport network.

The wireless network 100 may include one or more relay stations. A relay station is an entity that can receive a transmission of data from an upstream station (e.g., a base station 110 or a UE 120) and send a transmission of the data to a downstream station (e.g., a UE 120 or a base station 110). A relay station may be a UE 120 that can relay transmissions for other UEs 120. In the example shown in FIG. 1, the BS 110d (e.g., a relay base station) may communicate with the BS 110a (e.g., a macro base station) and the UE 120d in order to facilitate communication between the BS 110a and the UE 120d. A base station 110 that relays communications may be referred to as a relay station, a relay base station, a relay, or the like.

The wireless network 100 may be a heterogeneous network that includes base stations 110 of different types, such as macro base stations, pico base stations, femto base stations, relay base stations, or the like. These different types of base stations 110 may have different transmit power levels, different coverage areas, and/or different impacts on interference in the wireless network 100. For example, macro base stations may have a high transmit power level (e.g., 5 to 40 watts) whereas pico base stations, femto base stations, and relay base stations may have lower transmit power levels (e.g., 0.1 to 2 watts).

A network controller 130 may couple to or communicate with a set of base stations 110 and may provide coordination and control for these base stations 110. The network controller 130 may communicate with the base stations 110 via a backhaul communication link. The base stations 110 may communicate with one another directly or indirectly via a wireless or wireline backhaul communication link.

The UEs 120 may be dispersed throughout the wireless network 100, and each UE 120 may be stationary or mobile. A UE 120 may include, for example, an access terminal, a terminal, a mobile station, and/or a subscriber unit. A UE 120 may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device, a biometric device, a wearable device (e.g., a smart watch, smart clothing, smart glasses, a smart wristband, smart jewelry (e.g., a smart ring or a smart bracelet)), an entertainment device (e.g., a music device, a video device, and/or a satellite radio), a vehicular component or sensor, a smart meter/sensor, industrial manufacturing equipment, a global positioning system device, and/or any other suitable device that is configured to communicate via a wireless medium.

Some UEs 120 may be considered machine-type communication (MTC) or evolved or enhanced machine-type communication (eMTC) UEs. An MTC UE and/or an eMTC UE may include, for example, a robot, a drone, a remote device, a sensor, a meter, a monitor, and/or a location tag, that may communicate with a base station, another device (e.g., a remote device), or some other entity. Some UEs 120 may be considered Internet-of-Things (IOT) devices, and/or may be implemented as NB-IOT (narrowband IoT) devices. Some UEs 120 may be considered a Customer Premises Equipment. A UE 120 may be included inside a housing that houses components of the UE 120, such as processor components and/or memory components. In some examples, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks 100 may be deployed in a given geographic area. Each wireless network 100 may support a particular RAT and may operate on one or more frequencies. A RAT may be referred to as a radio technology, an air interface, or the like. A frequency may be referred to as a carrier, a frequency channel, or the like. Each frequency may support a single RAT in a given geographic area in order to avoid interference between wireless networks of different RATs. In some cases, NR or 5G RAT networks may be deployed.

In some examples, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, or a vehicle-to-pedestrian (V2P) protocol), and/or a mesh network. In such examples, a UE 120 may perform scheduling operations, resource selection operations, and/or other operations described elsewhere herein as being performed by the base station 110.

Devices of the wireless network 100 may communicate using the electromagnetic spectrum, which may be subdivided by frequency or wavelength into various classes, bands, channels, or the like. For example, devices of the wireless network 100 may communicate using one or more operating bands. In 5G NR, two initial operating bands have been identified as frequency range designations FR1 (410 MHz-7.125 GHz) and FR2 (24.25 GHZ-52.6 GHZ). It should be understood that although a portion of FR1 is greater than 6 GHZ, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHZ-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4a or FR4-1 (52.6 GHz-71 GHz), FR4 (52.6 GHz-114.25 GHZ), and FR5 (114.25 GHz-300 GHz). Each of these higher frequency bands falls within the EHF band.

With the above examples in mind, unless specifically stated otherwise, it should be understood that the term "sub-6 GHz" or the like, if used herein, may broadly represent frequencies that may be less than 6 GHZ, may be within FR1, or may include mid-band frequencies. Further, unless specifically stated otherwise, it should be understood that the term "millimeter wave" or the like, if used herein, may broadly represent frequencies that may include mid-band frequencies, may be within FR2, FR4, FR4-a or FR4-1, and/or FR5, or may be within the EHF band. It is contemplated that the frequencies included in these operating bands (e.g., FR1, FR2, FR3, FR4, FR4-a, FR4-1, and/or FR5) may be modified, and techniques described herein are applicable to those modified frequency ranges.

In some aspects, the UE 120 may include a communication manager 140. As described in more detail elsewhere herein, the communication manager 140 may receive a configuration indicating one or more directions for applying directional digital pre-distortion (DPD) to mitigate interference in a direction to another UE; and transmit a communication to a wireless node based at least in part on applying the directional DPD according to the configuration. Additionally, or alternatively, the communication manager 140 may perform one or more other operations described herein.

In some aspects, the base station 110 may include a communication manager 150. As described in more detail elsewhere herein, the communication manager 150 may transmit, to a first UE, a configuration indicating one or more directions for applying directional DPD to mitigate interference in a direction to a second UE; and receive, from the first UE and via a main uplink beam, a communication based at least in part on the first UE applying the directional DPD according to the configuration. Additionally, or alternatively, the communication manager 150 may perform one or more other operations described herein.

As indicated above, FIG. 1 is provided as an example. Other examples may differ from what is described with regard to FIG. 1.

Figure 2:
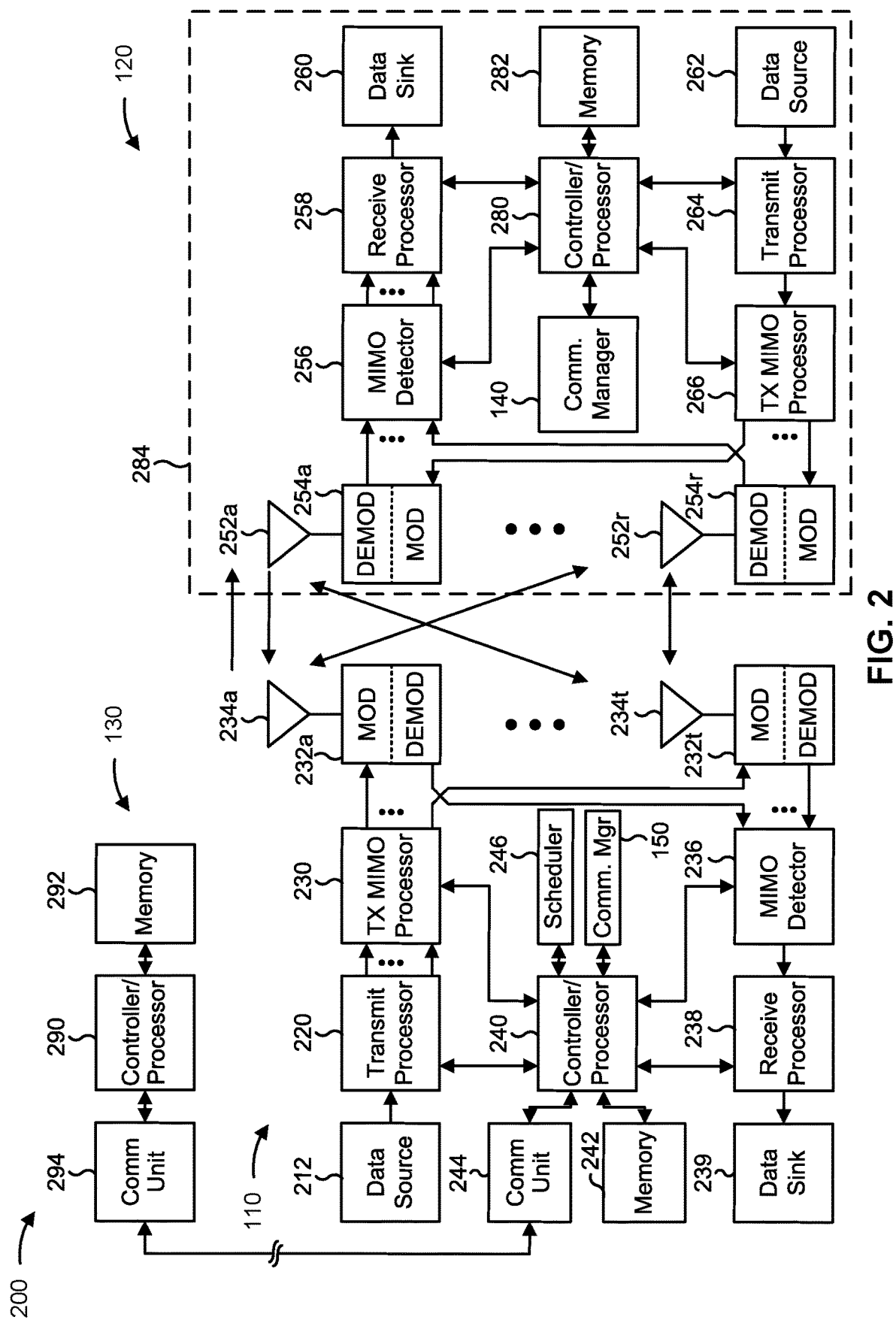
FIG. 2 is a diagram illustrating an example of a base station in communication with a user equipment (UE) in a wireless network, in accordance with the present disclosure.

FIG. 2 is a diagram illustrating an example 200 of a base station 110 in communication with a UE 120 in a wireless network 100, in accordance with the present disclosure. The base station 110 may be equipped with a set of antennas 234a through 234t, such as T antennas (T≥1). The UE 120 may be equipped with a set of antennas 252a through 252r, such as R antennas (R≥1).

At the base station 110, a transmit processor 220 may receive data, from a data source 212, intended for the UE 120 (or a set of UEs 120). The transmit processor 220 may select one or more modulation and coding schemes (MCSs) for the UE 120 based at least in part on one or more channel quality indicators (CQIs) received from that UE 120. The base station 110 may process (e.g., encode and modulate) the data for the UE 120 based at least in part on the MCS(s) selected for the UE 120 and may provide data symbols for the UE 120. The transmit processor 220 may process system information (e.g., for semi-static resource partitioning information (SRPI)) and control information (e.g., CQI requests, grants, and/or upper layer signaling) and provide overhead symbols and control symbols. The transmit processor 220 may generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide a set of output symbol streams (e.g., T output symbol streams) to a corresponding set of modems 232 (e.g., T modems), shown as modems 232a through 232t. For example, each output symbol stream may be provided to a modulator component (shown as MOD) of a modem 232. Each modem 232 may use a respective modulator component to process a respective output symbol stream (e.g., for OFDM) to obtain an output sample stream. Each modem 232 may further use a respective modulator component to process (e.g., convert to analog, amplify, filter, and/or upconvert) the output sample stream to obtain a downlink signal. The modems 232a through 232t may transmit a set of downlink signals (e.g., T downlink signals) via a corresponding set of antennas 234 (e.g., T antennas), shown as antennas 234a through 234t.

At the UE 120, a set of antennas 252 (shown as antennas 252a through 252r) may receive the downlink signals from the base station 110 and/or other base stations 110 and may provide a set of received signals (e.g., R received signals) to a set of modems 254 (e.g., R modems), shown as modems 254a through 254r. For example, each received signal may be provided to a demodulator component (shown as DEMOD) of a modem 254. Each modem 254 may use a respective demodulator component to condition (e.g., filter, amplify, downconvert, and/or digitize) a received signal to obtain input samples. Each modem 254 may use a demodulator component to further process the input samples (e.g., for OFDM) to obtain received symbols. A MIMO detector 256 may obtain received symbols from the modems 254, may perform MIMO detection on the received symbols if applicable, and may provide detected symbols. A receive processor 258 may process (e.g., demodulate and decode)

the detected symbols, may provide decoded data for the UE 120 to a data sink 260, and may provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a CQI parameter, among other examples. In some examples, one or more components of the UE 120 may be included in a housing 284.

The network controller 130 may include a communication unit 294, a controller/processor 290, and a memory 292. The network controller 130 may include, for example, one or more devices in a core network. The network controller 130 may communicate with the base station 110 via the communication unit 294.

One or more antennas (e.g., antennas 234a through 234t and/or antennas 252a through 252r) may include, or may be included within, one or more antenna panels, one or more antenna groups, one or more sets of antenna elements, and/or one or more antenna arrays, among other examples. An antenna panel, an antenna group, a set of antenna elements, and/or an antenna array may include one or more antenna elements (within a single housing or multiple housings), a set of coplanar antenna elements, a set of non-coplanar antenna elements, and/or one or more antenna elements coupled to one or more transmission and/or reception components, such as one or more components of FIG. 2.

On the uplink, at the UE 120, a transmit processor 264 may receive and process data from a data source 262 and control information (e.g., for reports that include RSRP, RSSI, RSRQ, and/or CQI) from the controller/processor 280. The transmit processor 264 may generate reference symbols for one or more reference signals. The symbols from the transmit processor 264 may be precoded by a TX MIMO processor 266 if applicable, further processed by the modems 254 (e.g., for DFT-s-OFDM or CP-OFDM), and transmitted to the base station 110. In some examples, the modem 254 of the UE 120 may include a modulator and a demodulator. In some examples, the UE 120 includes a transceiver. The transceiver may include any combination of the antenna(s) 252, the modem(s) 254, the MIMO detector 256, the receive processor 258, the transmit processor 264, and/or the TX MIMO processor 266. The transceiver may be used by a processor (e.g., the controller/processor 280) and the memory 282 to perform aspects of any of the methods described herein (e.g., with reference to FIGS. 4-9).

At the base station 110, the uplink signals from UE 120 and/or other UEs may be received by the antennas 234, processed by the modem 232 (e.g., a demodulator component, shown as DEMOD, of the modem 232), detected by a MIMO detector 236 if applicable, and further processed by a receive processor 238 to obtain decoded data and control information sent by the UE 120. The receive processor 238 may provide the decoded data to a data sink 239 and provide the decoded control information to the controller/processor 240. The base station 110 may include a communication unit 244 and may communicate with the network controller 130 via the communication unit 244. The base station 110 may include a scheduler 246 to schedule one or more UEs 120 for downlink and/or uplink communications. In some examples, the modem 232 of the base station 110 may include a modulator and a demodulator. In some examples, the base station 110 includes a transceiver. The transceiver may include any combination of the antenna(s) 234, the modem(s) 232, the MIMO detector 236, the receive processor 238, the transmit processor 220, and/or the TX MIMO processor 230. The transceiver may be used by a processor (e.g., the controller/processor 240) and the memory 242 to perform aspects of any of the methods described herein (e.g., with reference to FIGS. 4-9).

The controller/processor 240 of the base station 110, the controller/processor 280 of the UE 120, and/or any other component(s) of FIG. 2 may perform one or more techniques associated with directional DPD for inter-UE interference mitigation, as described in more detail elsewhere herein. For example, the controller/processor 240 of the base station 110, the controller/processor 280 of the UE 120, and/or any other component(s) of FIG. 2 may perform or direct operations of, for example, process 600 of FIG. 6, process 700 of FIG. 7, and/or other processes as described herein. The memory 242 and the memory 282 may store data and program codes for the base station 110 and the UE 120, respectively. In some examples, the memory 242 and/or the memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the base station 110 and/or the UE 120, may cause the one or more processors, the UE 120, and/or the base station 110 to perform or direct operations of, for example, process 600 of FIG. 6, process 700 of FIG. 7, and/or other processes as described herein. In some examples, executing instructions may include running the instructions, converting the instructions, compiling the instructions, and/or interpreting the instructions, among other examples.

In some aspects, the UE includes means for receiving a configuration indicating one or more directions for applying directional DPD to mitigate interference in a direction to another UE; and/or means for transmitting a communication to a wireless node based at least in part on applying the directional DPD according to the configuration. The means for the UE to perform operations described herein may include, for example, one or more of communication manager 140, antenna 252, modem 254, MIMO detector 256, receive processor 258, transmit processor 264, TX MIMO processor 266, controller/processor 280, or memory 282.

In some aspects, the base station includes means for transmitting, to a first UE, a configuration indicating one or more directions for applying directional DPD to mitigate interference in a direction to a second UE; and/or means for receiving, from the first UE and via a main uplink beam, a communication based at least in part on the first UE applying the directional DPD according to the configuration. The means for the base station to perform operations described herein may include, for example, one or more of communication manager 150, transmit processor 220, TX MIMO processor 230, modem 232, antenna 234, MIMO detector 236, receive processor 238, controller/processor 240, memory 242, or scheduler 246.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of the controller/processor 280.

As indicated above, FIG. 2 is provided as an example. Other examples may differ from what is described with regard to FIG. 2.

Figure 3:
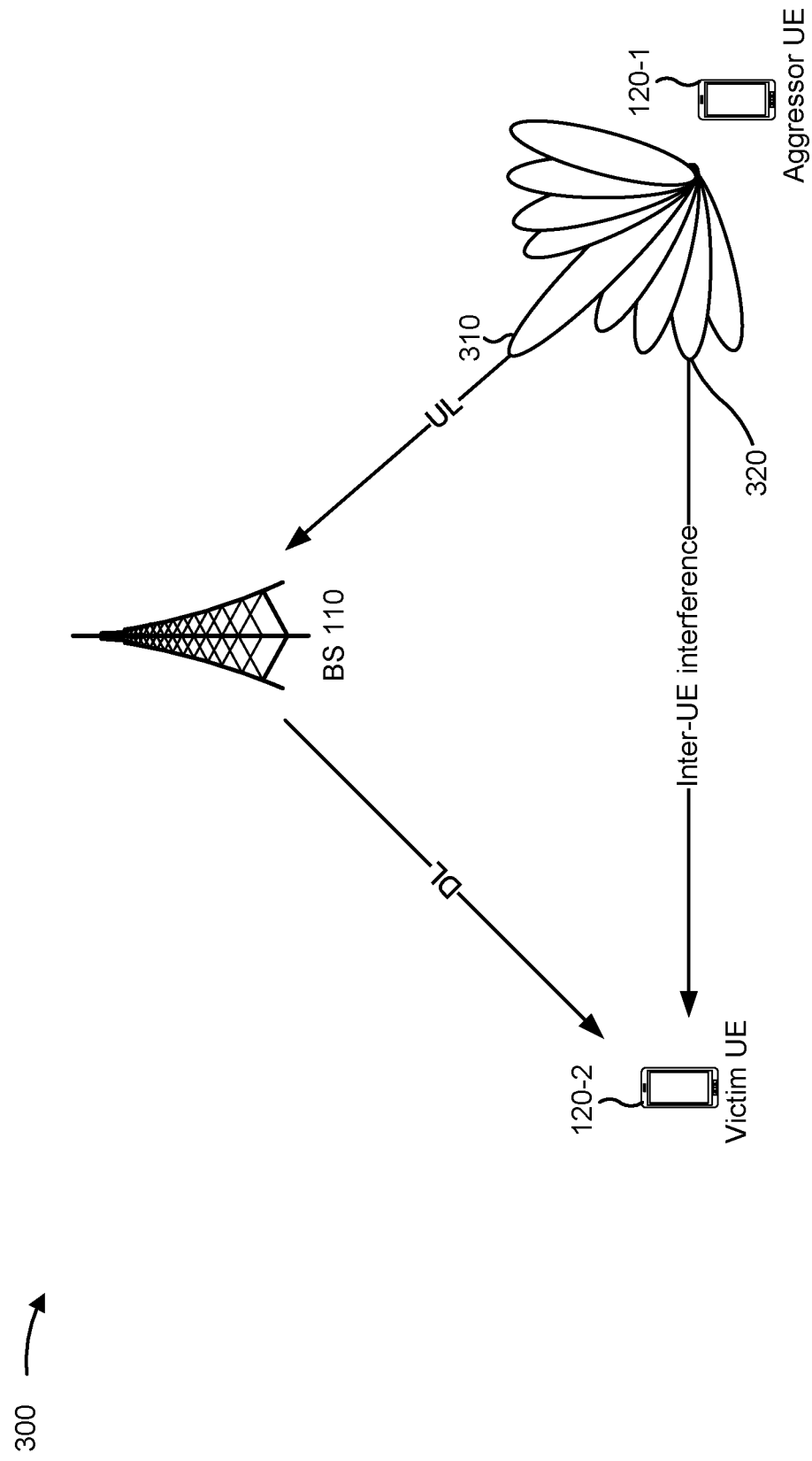
FIG. 3 is a diagram illustrating an example of inter-UE interference, in accordance with the present disclosure.

FIG. 3 is a diagram illustrating an example 300 of inter-UE interference, in accordance with the present disclosure. As shown, example 300 includes a base station 110, a first UE 120-1, and a second UE 120-2. In some examples, the base station 110 may be capable of full-duplex communication. In some examples, the first UE 120-1 and/or the second UE 120-2 may also be capable of full-duplex communication.

Full-duplex communication may include a contemporaneous uplink and downlink communication using the same resources. For example, as shown in FIG. 3, the base station 10 may transmit a downlink (DL) communication to the second UE 120-2 and may receive an uplink (UL) communication from the first UE 120-1 using the same or different frequency resources and at least partially overlapping time domain resources. In this case, the second UE 120-2, when receiving the downlink communication from the base station 110, may experience interference from the transmission of the uplink communication by the first UE 120-1. Such interference at one UE (e.g., the second UE 120-2) that is caused by a transmission from another UE (e.g., the first UE 120-1) may be referred to as "inter-UE interference." In the case of inter-UE interference, the UE that experiences the interference (e.g., the second UE 120-2) may be referred to as a victim UE, and the UE that causes the interference (e.g., the first UE 120-1) may be referred to as the aggressor UE. Inter-UE interference may result in degradation of the signal quality of downlink communications, which may adversely affect the ability of the victim UE (e.g., the second UE 120-2) to reliably decode the downlink communications.

In some cases, inter-UE interference may result from a transmitter that, as power increases, transmits signals with increasing non-linearity. For example, the first UE 120-1 may include a power amplifier (PA) that distorts a transmitted signal as a result of a relatively higher peak to average power ratio. The non-linear distortion may be an in-band distortion, which affects link performance in connection with an error vector magnitude (EVM) amount, or out-of-band distortion, which causes adjacent channel interference (e.g., inter-UE interference).

In some instances, the UE may perform digital pre-distortion (DPD) to address the distortion of the transmitted signal. DPD is a technique used to reverse the impact of the non-linearity caused by the PA at the transmitter side. In general, DPD may apply inverse distortion (e.g., using a pre-distorter) at an input signal of the PA to cancel the distortion generated by the PA.

In some cases, DPD may be designed based at least in part on observing the output of the PA, modeling the PA based at least in part on the output, and computing the inverse of the model. The coefficients or weights used to model the PA, and/or to compute the inverse of the model, may be selected to minimize EVM for a main transmission beam 310. However, with respect to inter-UE interference, the interference may not come from the main transmission beam 310. For example, out-of-band distortion causing adjacent channel interference to the second UE 120-2 (e.g., inter-UE interference) may come from a beam other than the main transmission beam (e.g., beam 320, as shown in FIG. 3).

Some techniques and apparatuses described herein enable a wireless node (e.g., the first UE 120-1) to apply directional DPD to mitigate inter-UE interference. "Directional DPD" may refer to applying DPD to reduce out-of-band distortion causing adjacent channel interference in a given direction (e.g., a direction of the second UE 120-2) that may come from a beam other than the main transmission beam. As a result, the first UE 120-1 may reduce inter-UE interference between the first UE 120-1 and the second UE 120-2, which may result in improved reliability in receiving downlink communications by the second UE 120-2.

As indicated above, FIG. 3 is provided as an example. Other examples may differ from what is described with respect to FIG. 3.

Figure 4:
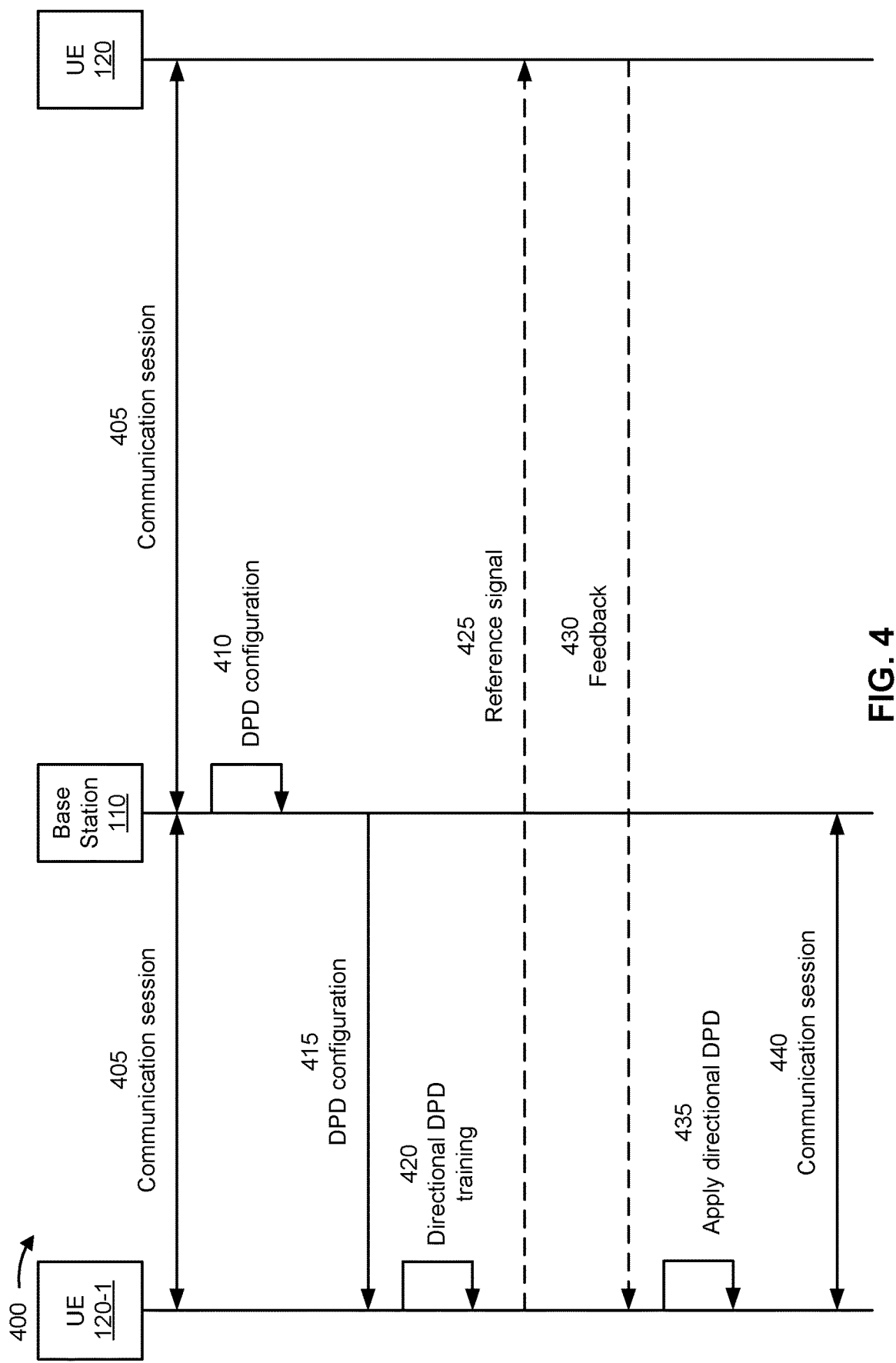
FIGS. 4 and 5 are diagrams illustrating examples associated with directional digital pre-distortion (DPD) for inter-UE interference mitigation, in accordance with the present disclosure.
Figure 5:
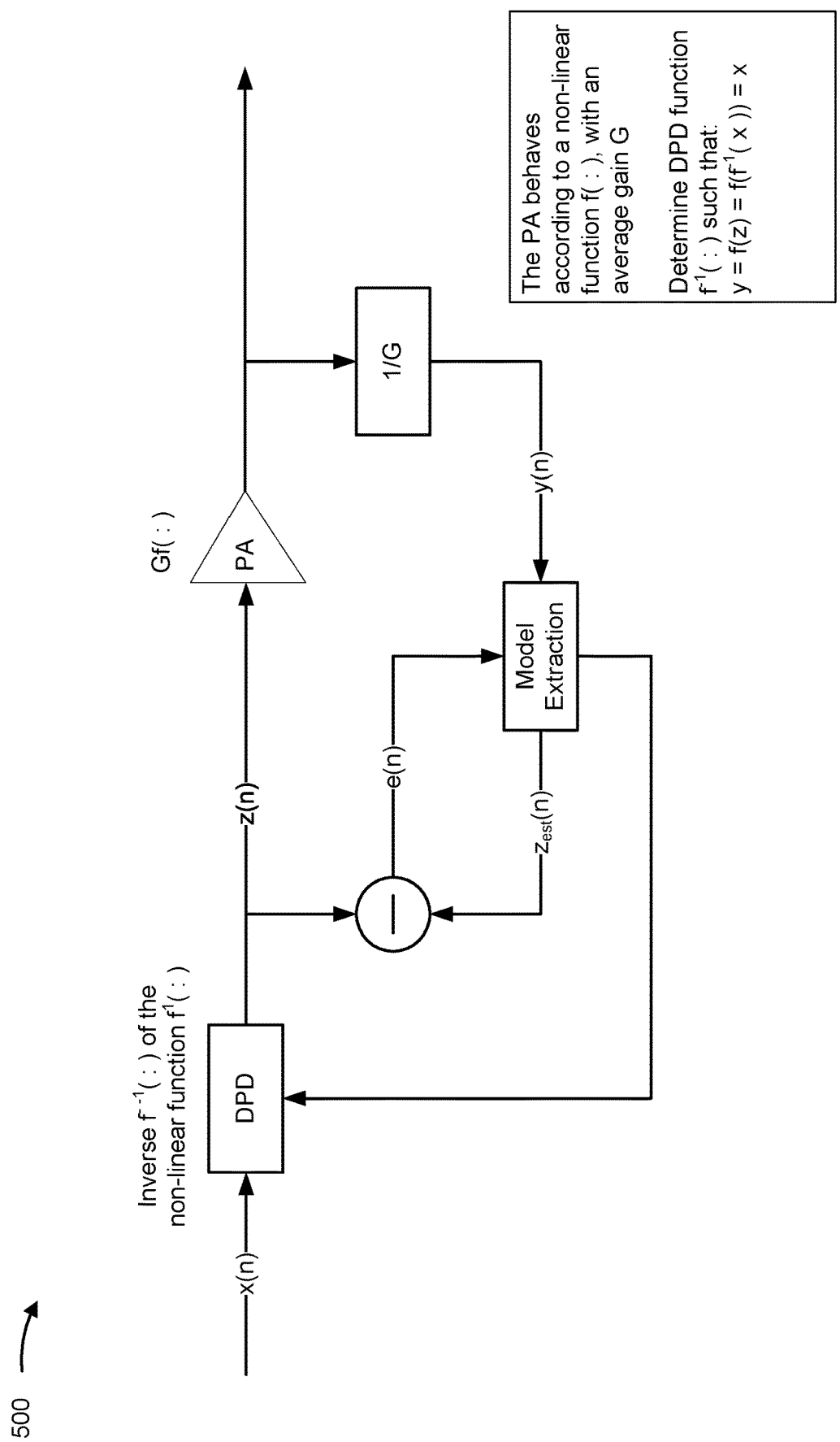

FIGS. 4 and 5 are diagrams illustrating examples 400 and 500 associated with directional DPD for inter-UE interference mitigation, in accordance with the present disclosure. As shown in FIG. 4, example 400 includes communication between a base station 110, a first UE 120-1, and a second UE 120-2. In some aspects, the base station 110, the first UE 120-1, and the second UE 120-2 may be included in a wireless network, such as wireless network 100. The base station 110, the first UE 120-1, and the second UE 120-2 may communicate via a wireless access link, which may include an uplink and a downlink. In some implementations, the first UE 120-1 and the second UE 120-2 may communicate via sidelink communications.

As shown by reference number 405, the first UE 120-1 and the second UE 120-2 may each establish a communication session with the base station 110. For example, the first UE 120-1 or the second UE 120-2 may establish a communication with the base station 110 based at least in part on the first UE 120-1 or the second UE 120-2 entering a coverage area of the base station 110, being powered on, or transitioning from an idle mode to an active mode, among other examples.

As shown by reference number 410, the base station 110 may determine a DPD configuration for the first UE 120-1. In some aspects, the base station 110 may determine the DPD configuration for the first UE 120-1 based at least in part on determining that a level of inter-UE interference at the second UE 120-2 satisfies a threshold. In some aspects, the base station 110 may determine that the level of inter-UE interference satisfies the threshold based at least in part on information (e.g., UE capability information, a channel quality indicator (CQI), a set of uplink resources associated with the first UE 120-1, a set of downlink resources associated with the second UE 120-2, a distance that the second UE 120-2 is from the first UE 120-1, or a direction from the first UE 120-1 to the second UE 120-2, among other examples) associated with the second UE 120-2 and/or the first UE 120-1.

In some aspects, the configuration may indicate a set of averaging weights associated with the first UE 120-1 performing DPD training. For example, the set of averaging weights may be for the inverse PA model utilized to apply directional DPD for a beam corresponding to a direction to the second UE 120-2. In some aspects, the configuration expressly indicates the set of averaging weights.

In some aspects, the configuration indirectly indicates the set of averaging weights. For example, the configuration may indicate a priority of the beam associated with the direction to the second UE 120-2, relative to a priority of the main uplink transmission beam, or how much to account for a reduction in interference for the beam associated with the direction to the second UE 120-2, relative to a reduction in interference for the main uplink transmission beam.

In some aspects, the set of averaging weights may include one or more first averaging weights associated with one or more first DPD coefficients. The one or more first DPD coefficients may be associated with a main uplink transmission beam of the first UE 120-1. For example, the one or more first DPD coefficients may include a channel phase coefficient or a beam forming phase coefficient, among other examples, associated with the main uplink transmission beam.

In some aspects, the set of averaging weights may include one or more second averaging weights associated with one or more second DPD coefficients. The one or more second DPD coefficients may be associated with a beam other than the main uplink transmission beam of the first UE 120-1 (e.g., a beam associated with the direction to the second UE 120-2). For example, the one or more second DPD coefficients may include a channel phase coefficient or a beam forming phase coefficient, among other examples, associated with the other beam (e.g., beam associated with the direction to the second UE 120-2).

As an example, the base station 110 may determine to maintain a highest EVM in the main uplink transmission beam. The configuration may indicate a highest value (e.g., 1) for the one or more first averaging weights and a lowest value (e.g., 0) for the one or more second averaging weights.

As another example, the base station 110 may determine to maintain a smallest level of inter-UE interference at the second UE 120-2. The configuration may indicate a lowest value (e.g., 0) for the one or more first averaging weights and a highest value (e.g., 1) for the one or more second averaging weights.

As another example, the base station 110 may determine to balance an EVM in the main uplink transmission beam and a level of inter-UE interference at the second UE 120-2. The configuration may indicate a same value (e.g., 0.5 or 1, among other examples) for the one or more first averaging weights and the one or more second averaging weights.

In some aspects, the configuration indicates a quantity of DPD coefficients included in the combination of DPD coefficients. For example, the configuration may indicate a quantity of first DPD coefficients and a quantity of second DPD coefficients.

In some aspects, the first UE 120-1 may determine a combination of DPD coefficients. In some aspects, the combination of DPD coefficients may be selected based at least in part on restricting an EVM of an uplink signal on the main uplink transmission beam to maintain a minimum (e.g., less than a threshold) signal to interference plus noise ratio (SINR) at the base station 110.

In some aspects, the combination of DPD coefficients includes a set of first DPD coefficients and a set of second DPD coefficients. The set of first DPD coefficients may include one or more DPD coefficients associated with a main uplink transmission beam.

The set of second DPD coefficients may include one or more DPD coefficients associated with a beam other than the main transmission uplink beam. In some aspects, the set of second DPD coefficients includes a DPD coefficient selected from a DPD look-up table. The selected DPD coefficient may correspond to a beam forming steering angle of a particular beam (e.g., a beam in a direction of the second UE 120-2).

As shown by reference number 415, the base station 110 may transmit, and the first UE 120-1 may receive, the DPD configuration. For example, the base station 110 may transmit the DPD configuration via DCI (e.g., DCI scheduling an uplink transmission on the main uplink transmission beam), a MAC-CE, or an RRC configuration, among other examples. In some aspects, the base station 110 may transmit the DPD configuration via DCI. The DCI may include one or more bits (e.g., two bits, three bits, or four bits, among other examples) indicating a percentage of the DPD coefficients that are to be first DPD coefficients, a percentage of the DPD coefficients that are to be second DPD coefficients, or a ratio of first DPD coefficients to second DPD coefficients in the combination of DPD coefficients, among other examples.

As shown by reference number 420, the first UE 120-1 may perform directional DPD training based at least in part on the configuration. In some aspects, the first UE 120-1 may determine the set of averaging weights and/or the combination of DPD coefficients based at least in part on the configuration and may perform the directional DPD training based at least in part on the set of averaging weights and/or the combination of DPD coefficients.

In some aspects, the configuration may indicate a quantity of the first DPD coefficients, a quantity of the second DPD coefficients, and a direction to the second UE 120-2. The first UE 120-1 may determine the quantity of the first DPD coefficients based at least in part on a look-up table associated with a steering angle or a beam forming angle associated with the main uplink transmission beam. The first UE 120-1 may determine the quantity of the second DPD coefficients based at least in part on a look-up table associated with a steering angle or a beam forming angle associated with the beam in the direction to the second UE 120-2.

In some aspects, the first UE 120-1 may perform the directional DPD training based at least in part on generating a model of the PA and determining an inverse of the model of the PA. The first UE 120-1 may generate the model and/or determine the inverse of the model based at least in part on the set of averaging weights and/or the combination of DPD coefficients indicated by the DPD configuration. In some aspects, as shown in FIG. 5, the model may be trained based at least in part on feedback (e.g., an output) from the PA. The output of the PA may be divided by a gain ((3) of the PA and may be provided as an input to a model extraction component that is configured to generate the model of the PA and/or to determine the inverse of the model of the PA.

In some aspects, as shown in FIG. 4, and by reference number 425, the first UE 120-1 may transmit, to the second UE 120-2, a reference signal for estimating the combined DPD coefficients. In some aspects, the reference signal may be transmitted via sidelink communications.

In some aspects, as shown by reference number 430, the second UE 120-2 may transmit feedback to the first UE 120-1. In some aspects, the first UE 120-1 may transmit an indication of a quantity of non-linear kernels to be used in estimating the combined DPD coefficients. The second UE 120-2 may determine the feedback based at least in part on the quantity of non-linear kernels to be used in estimating the combined DPD coefficients and may transmit the determined feedback to the first UE 120-1.

In some aspects, the feedback may be transmitted via sidelink communications. For example, the second UE 120-2 may transmit the feedback to the first UE 120-1 via a sidelink data channel (e.g., a physical sidelink shared channel (PSSCH)). The first UE 120-1 may derive one or more DPD coefficients of the combined DPD coefficients based at least in part on the feedback. By deriving the one or more DPD coefficients based at least in part on the feedback, applying the directional DPD may minimize out-of-band emissions in the direction to the second UE 120-2.

As shown by reference number 435, the first UE 120-1 may apply directional DPD based at least in part on the configuration. As shown by reference number 440, the first UE 120-1 may communicate with the base station 110 via the communication session based at least in part on applying the directional DPD.

In some aspects, the first UE 120-1 may communicate with the base station 110 based at least in part on applying the directional DPD to restrict an EVM of an uplink signal transmitted via the main uplink transmission beam. The EVM of the uplink signal may be restricted to maintain a minimum SINR at the base station 110 (e.g., an SINR that satisfies an SINR threshold). Alternatively, or additionally, the first UE 120-1 may communicate with the base station 110 based at least in part on applying the directional DPD to minimize out-of-band emissions in the direction to the second UE 120-2. For example, the first UE 120-1 may determine the combined DPD coefficients based at least in part on the feedback received from the second UE 120-2, as described elsewhere herein.

As described above, the first UE 120-1 may apply directional DPD to reduce out-of-band distortion causing adjacent channel interference in the direction of the second UE 120-2 that may come from a beam other than the main transmission beam while maintaining a minimum SINR at the base station 110. As a result, the first UE 120-1 may reduce inter-UE interference between the first UE 120-1 and the second UE 120-2, which may result in improved reliability in receiving downlink communications by the second UE 120-2.

As indicated above, FIGS. 4 and 5 are provided as an example. Other examples may differ from what is described with respect to FIGS. 4 and 5.

Figure 6:
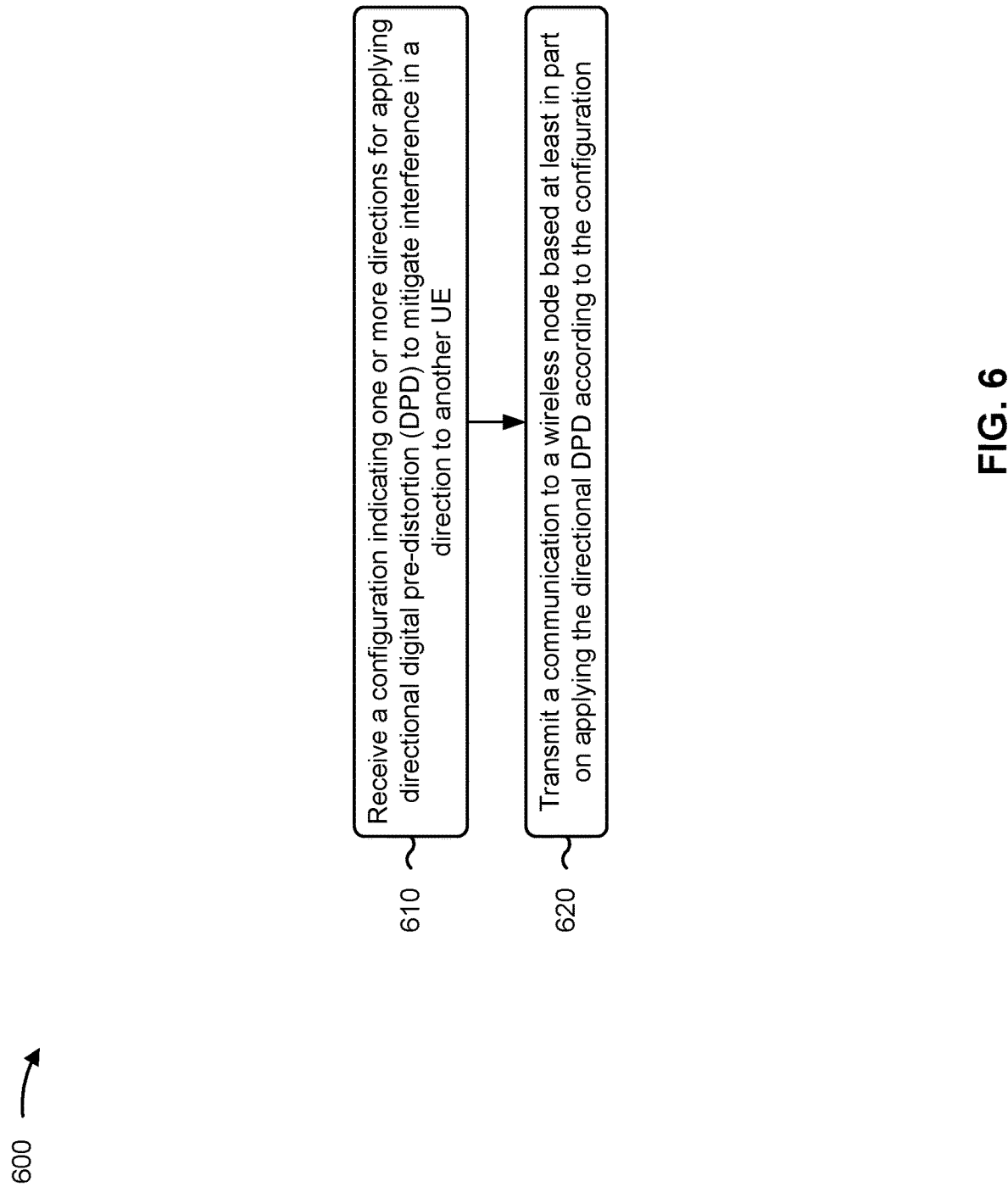
FIGS. 6 and 7 are diagrams illustrating example processes associated with directional DPD for inter-UE interference mitigation, in accordance with the present disclosure.

FIG. 6 is a diagram illustrating an example process 600 performed, for example, by a UE, in accordance with the present disclosure. Example process 600 is an example where the UE (e.g., UE 120) performs operations associated with directional DPD for inter-UE mitigation.

As shown in FIG. 6, in some aspects, process 600 may include receiving a configuration indicating one or more directions for applying DPD to mitigate interference in a direction to another UE (block 610). For example, the UE (e.g., using communication manager 140 and/or reception component 802, depicted in FIG. 8) may receive a configuration indicating one or more directions for applying DPD to mitigate interference in a direction to another UE, as described above.

As further shown in FIG. 6, in some aspects, process 600 may include transmitting a communication to a wireless node based at least in part on applying the directional DPD according to the configuration (block 620). For example, the UE (e.g., using communication manager 140 and/or transmission component 804, depicted in FIG. 8) may transmit a communication to a wireless node (e.g., a base station 110) based at least in part on applying the directional DPD according to the configuration, as described above.

Process 600 may include additional aspects, such as any single aspect or any combination of aspects described below and/or in connection with one or more other processes described elsewhere herein.

In a first aspect, a DPD coefficient selected from a DPD look-up table corresponds to a beam forming steering angle of a particular beam.

In a second aspect, alone or in combination with the first aspect, transmitting the communication includes restricting an EVM of an uplink signal on a main beam to maintain an SINR at the wireless node.

In a third aspect, alone or in combination with one or more of the first and second aspects, the directional DPD is applied based at least in part on a combination of DPD coefficients, wherein the combination of DPD coefficients includes one or more first DPD coefficients for a beam associated with the direction to the other UE and one or more second DPD coefficients for a main uplink beam.

In a fourth aspect, alone or in combination with one or more of the first through third aspects, process 600 includes receiving an indication of a set of averaging weights associated with the combination of DPD coefficients, wherein the set of averaging weights includes one or more first averaging weights associated with the one or more first DPD coefficients and one or more second averaging weights associated with the one or more second DPD coefficients, and the directional DPD is applied based at least in part on applying the set of averaging weights to the combination of DPD coefficients.

In a fifth aspect, alone or in combination with one or more of the first through fourth aspects, the indication of the set of averaging weights indicates a priority of the beam associated with the direction to the other UE relative to a priority of the main uplink beam.

In a sixth aspect, alone or in combination with one or more of the first through fifth aspects, process 600 includes receiving an indication of a quantity of the one or more first DPD coefficients to be included in the combination of DPD coefficients and a quantity of the one or more second DPD coefficients to be included in the combination of DPD coefficients.

In a seventh aspect, alone or in combination with one or more of the first through sixth aspects, the indication of the quantity of the one or more first DPD coefficients to be included in the combination of DPD coefficients and the quantity of the one or more second DPD coefficients to be included in the combination of DPD coefficients is received via DCI scheduling an uplink transmission on the main uplink beam, a MAC-CE, or an RRC configuration.

In an eighth aspect, alone or in combination with one or more of the first through seventh aspects, the quantity of the one or more first DPD coefficients to be included in the combination of DPD coefficients and the quantity of the one or more second DPD coefficients to be included in the combination of DPD coefficients is determined based at least in part on the beam associated with the direction of the other UE and a distance to the other UE.

In a ninth aspect, alone or in combination with one or more of the first through eighth aspects, the indication of the quantity of the one or more first DPD coefficients to be included in the combination of DPD coefficients and the quantity of the one or more second DPD coefficients to be included in the combination of DPD coefficients comprises one or more bits indicating a percentage of DPD coefficients of the main uplink beam to be included in the combination of DPD coefficients.

In a tenth aspect, alone or in combination with one or more of the first through ninth aspects, the one or more bits indicating the percentage of the DPD coefficients of the main uplink beam to be included in the combination of DPD coefficients includes two bits.

In an eleventh aspect, alone or in combination with one or more of the first through tenth aspects, process 600 includes transmitting, via sidelink communication, a reference signal for estimating a set of non-linear model coefficients to the other UE, and receiving feedback indicating end-to-end non-linear model coefficients from the other UE, wherein a set of DPD coefficients is derived based at least in part on the feedback.

In a twelfth aspect, alone or in combination with one or more of the first through eleventh aspects, the set of DPD coefficients minimizes out-of-band emission in the direction to the other UE.

In a thirteenth aspect, alone or in combination with one or more of the first through twelfth aspects, the feedback is received via a physical sidelink shared channel (PSSCH).

Although FIG. 6 shows example blocks of process 600, in some aspects, process 600 may include additional blocks, fewer blocks, different blocks, or differently arranged blocks than those depicted in FIG. 6. Additionally, or alternatively, two or more of the blocks of process 600 may be performed in parallel.

Figure 7:
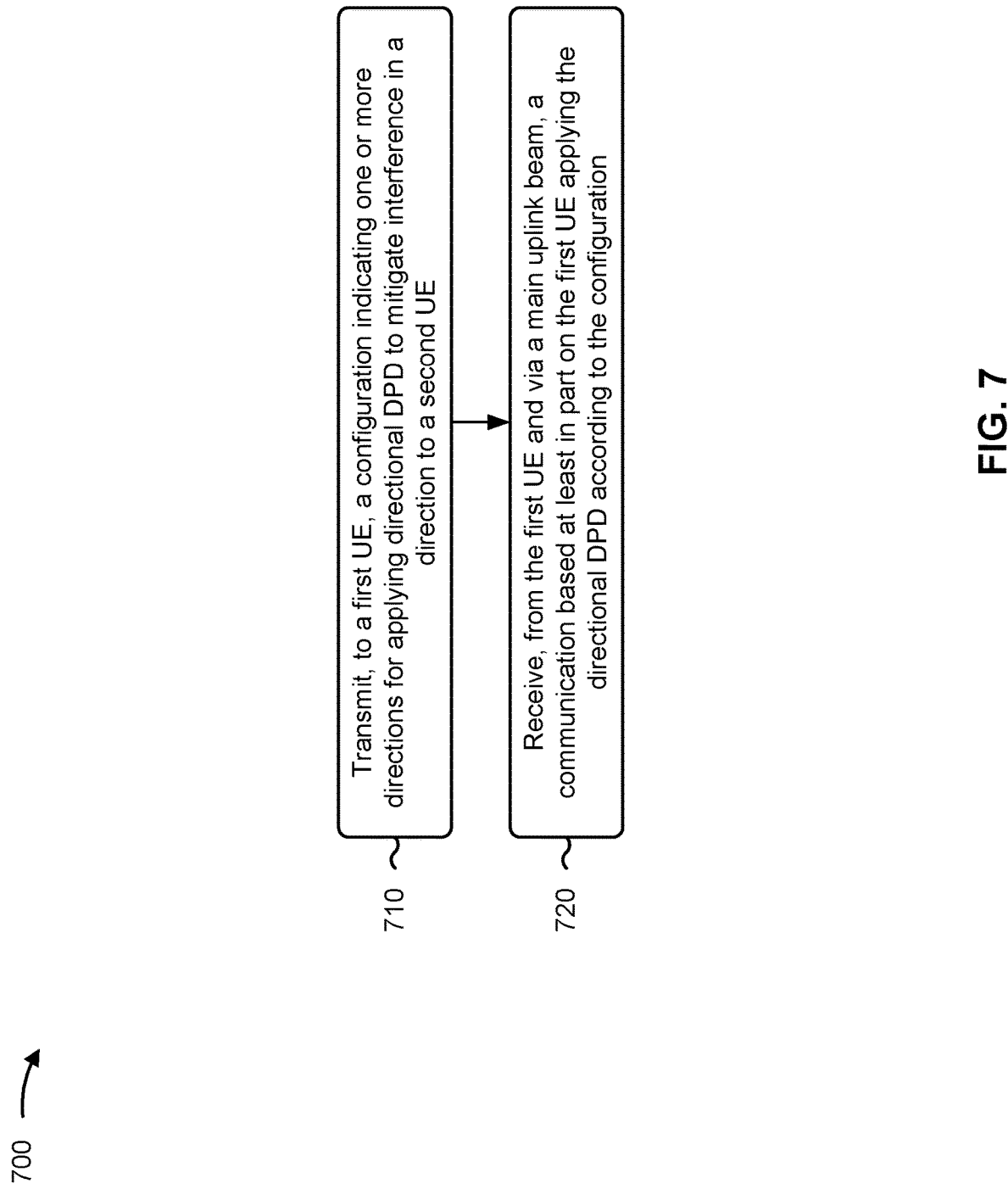

FIG. 7 is a diagram illustrating an example process 700 performed, for example, by a base station, in accordance with the present disclosure. Example process 700 is an example where the base station (e.g., base station 110) performs operations associated with directional DPD for inter-UE mitigation.

As shown in FIG. 7, in some aspects, process 700 may include transmitting, to a first UE, a configuration indicating one or more directions for applying directional DPD to mitigate interference in a direction to a second UE (block 710). For example, the base station (e.g., using communication manager 150 and/or transmission component 904, depicted in FIG. 9) may transmit, to a first UE, a configuration indicating one or more directions for applying directional DPD to mitigate interference in a direction to a second UE, as described above.

As further shown in FIG. 7, in some aspects, process 700 may include receiving, from the first UE and via a main uplink beam, a communication based at least in part on the first UE applying the directional DPD according to the configuration (block 720). For example, the base station (e.g., using communication manager 150 and/or reception component 902, depicted in FIG. 9) may receive, from the first UE and via a main uplink beam, a communication based at least in part on the first UE applying the directional DPD according to the configuration, as described above.

Process 700 may include additional aspects, such as any single aspect or any combination of aspects described below and/or in connection with one or more other processes described elsewhere herein.

In a first aspect, process 700 includes transmitting an indication of a set of averaging weights associated with a combination of DPD coefficients, wherein the set of averaging weights includes one or more first averaging weights associated with one or more first DPD coefficients for a beam associated with the direction to the second UE and one or more second averaging weights associated with one or more second DPD coefficients for the main uplink beam, and wherein the indication is transmitted to cause the first UE to apply the directional DPD based at least in part on applying the set of averaging weights to the combination of DPD coefficients.

In a second aspect, alone or in combination with the first aspect, the indication of the set of averaging weights indicates a priority of the beam associated with the direction to the other UE relative to a priority of the main uplink beam.

In a third aspect, alone or in combination with one or more of the first and second aspects, the indication of the set of averaging weights indicates a quantity of one or more first DPD coefficients to be included in the combination of DPD coefficients and a quantity of one or more second DPD coefficients to be included in the combination of DPD coefficients.

In a fourth aspect, alone or in combination with one or more of the first through third aspects, the quantity of the one or more first DPD coefficients to be included in the combination of DPD coefficients and the quantity of the one or more second DPD coefficients to be included in the combination of DPD coefficients is determined based at least in part on the beam associated with the direction of the other UE and a distance to the other UE.

In a fifth aspect, alone or in combination with one or more of the first through fourth aspects, an indication of the quantity of the one or more first DPD coefficients to be included in the combination of DPD coefficients and the quantity of the one or more second DPD coefficients to be included in the set of DPD coefficients comprises one or more bits indicating a percentage of DPD coefficients of the main uplink beam to be included in the set of DPD coefficients.

In a sixth aspect, alone or in combination with one or more of the first through fifth aspects, the one or more bits indicating the percentage of the DPD coefficients of the main uplink beam to be included in the combination of DPD coefficients includes two bits.

In a seventh aspect, alone or in combination with one or more of the first through sixth aspects, the indication of the set of averaging weights is transmitted via DCI scheduling an uplink transmission on the main uplink beam, a MAC-CE, or an RRC configuration.

Although FIG. 7 shows example blocks of process 700, in some aspects, process 700 may include additional blocks, fewer blocks, different blocks, or differently arranged blocks than those depicted in FIG. 7. Additionally, or alternatively, two or more of the blocks of process 700 may be performed in parallel.

Figure 8:
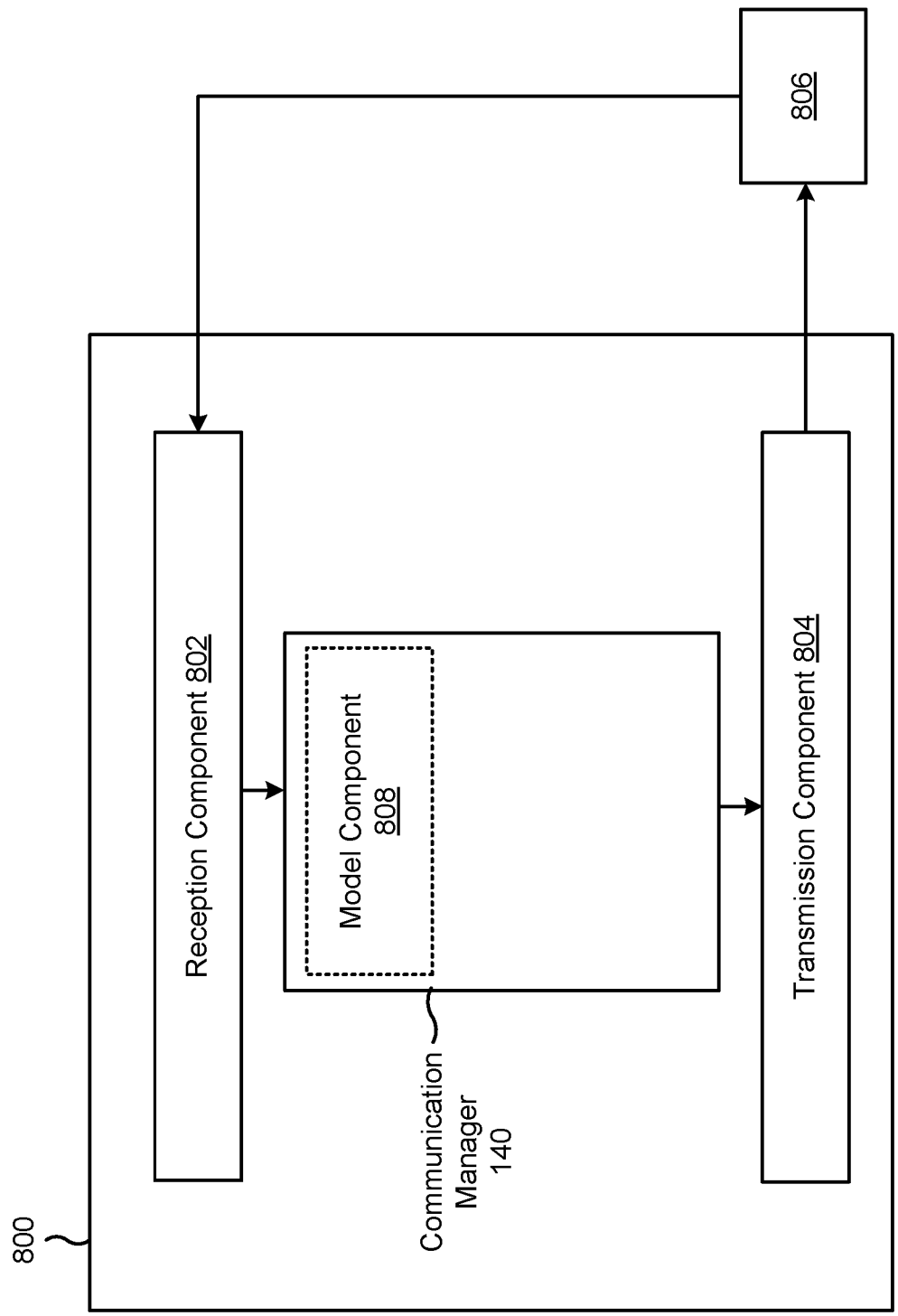
FIGS. 8 and 9 are diagrams of example apparatuses for wireless communication, in accordance with the present disclosure.

FIG. 8 is a diagram of an example apparatus 800 for wireless communication. The apparatus 800 may be a UE, or a UE may include the apparatus 800. In some aspects, the apparatus 800 includes a reception component 802 and a transmission component 804, which may be in communication with one another (for example, via one or more buses and/or one or more other components). As shown, the apparatus 800 may communicate with another apparatus 806 (such as a UE, a base station, or another wireless communication device) using the reception component 802 and the transmission component 804. As further shown, the apparatus 800 may include the communication manager 140. The communication manager 140 may include a model component 808, among other examples.

In some aspects, the apparatus 800 may be configured to perform one or more operations described herein in connection with FIGS. 4 and 5. Additionally, or alternatively, the apparatus 800 may be configured to perform one or more processes described herein, such as process 600 of FIG. 6. In some aspects, the apparatus 800 and/or one or more components shown in FIG. 8 may include one or more components of the UE described in connection with FIG. 2. Additionally, or alternatively, one or more components shown in FIG. 8 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 802 may receive communications, such as reference signals, control information, data communications, or a combination thereof, from the apparatus 806. The reception component 802 may provide received communications to one or more other components of the apparatus 800. In some aspects, the reception component 802 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 800. In some aspects, the reception component 802 may include one or more antennas, a modem, a demodulator, a MIMO detector, a receive processor, a controller/processor, a memory, or a combination thereof, of the UE described in connection with FIG. 2.

The transmission component 804 may transmit communications, such as reference signals, control information, data communications, or a combination thereof, to the apparatus 806. In some aspects, one or more other components of the apparatus 800 may generate communications and may provide the generated communications to the transmission component 804 for transmission to the apparatus 806. In some aspects, the transmission component 804 may perform signal processing on the generated communications (such as filtering, amplification, modulation, digital-to-analog conversion, multiplexing, interleaving, mapping, or encoding, among other examples), and may transmit the processed signals to the apparatus 806. In some aspects, the transmission component 804 may include one or more antennas, a modem, a modulator, a transmit MIMO processor, a transmit processor, a controller/processor, a memory, or a combination thereof, of the UE described in connection with FIG. 2. In some aspects, the transmission component 804 may be co-located with the reception component 802 in a transceiver.

The reception component 802 may receive a configuration indicating one or more directions for applying directional DPD to mitigate interference in a direction to another UE. The transmission component 804 may transmit a communication to a wireless node based at least in part on applying the directional DPD according to the configuration.

The reception component 802 may receive an indication of a set of averaging weights associated with the combination of DPD coefficients, wherein the set of averaging weights includes one or more first averaging weights associated with the one or more first DPD coefficients and one or more second averaging weights associated with the one or more second DPD coefficients, and the directional DPD is applied based at least in part on applying the set of averaging weights to the combination of DPD coefficients.

The reception component 802 may receive an indication of a quantity of the one or more first DPD coefficients to be included in the combination of DPD coefficients and a quantity of the one or more second DPD coefficients to be included in the combination of DPD coefficients.

The transmission component 804 may transmit, via sidelink communication, a reference signal for estimating a set of non-linear model coefficients to the other UE.

The reception component 802 may receive feedback indicating end-to-end non-linear model coefficients from the other UE. The model component 808 may derive a set of DPD coefficients based at least in part on the feedback.

The number and arrangement of components shown in FIG. 8 are provided as an example. In practice, there may be additional components, fewer components, different components, or differently arranged components than those shown in FIG. 8. Furthermore, two or more components shown in FIG. 8 may be implemented within a single component, or a single component shown in FIG. 8 may be implemented as multiple, distributed components. Additionally, or alternatively, a set of (one or more) components shown in FIG. 8 may perform one or more functions described as being performed by another set of components shown in FIG. 8.

Figure 9:
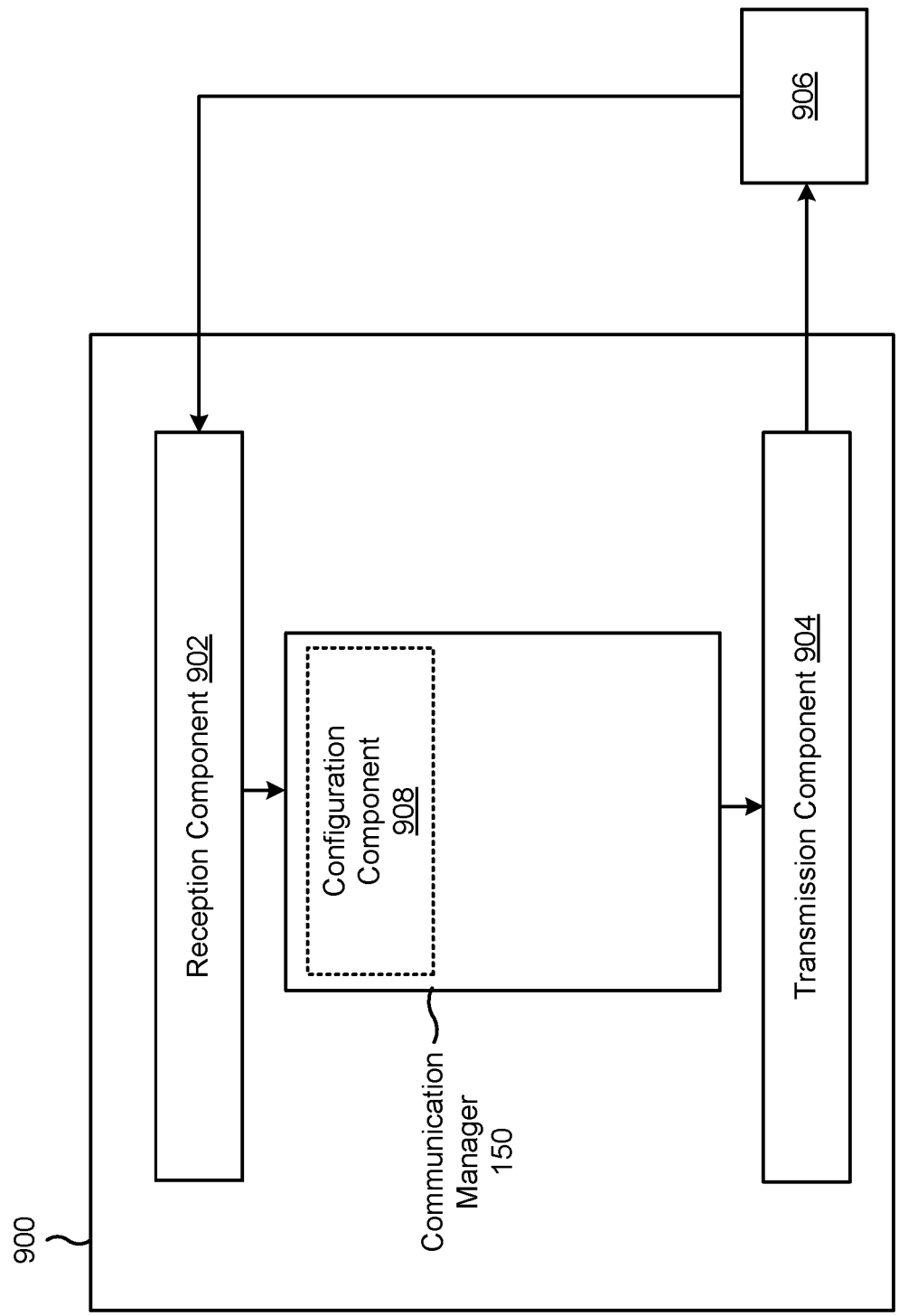

FIG. 9 is a diagram of an example apparatus 900 for wireless communication. The apparatus 900 may be a base station, or a base station may include the apparatus 900. In some aspects, the apparatus 900 includes a reception component 902 and a transmission component 904, which may be in communication with one another (for example, via one or more buses and/or one or more other components). As shown, the apparatus 900 may communicate with another apparatus 906 (such as a UE, a base station, or another wireless communication device) using the reception component 902 and the transmission component 904. As further shown, the apparatus 900 may include the communication manager 150. The communication manager 150 may include a configuration component 908, among other examples.

In some aspects, the apparatus 900 may be configured to perform one or more operations described herein in connection with FIGS. 4 and 5. Additionally, or alternatively, the apparatus 900 may be configured to perform one or more processes described herein, such as process 700 of FIG. 7. In some aspects, the apparatus 900 and/or one or more components shown in FIG. 9 may include one or more components of the base station described in connection with FIG. 2. Additionally, or alternatively, one or more components shown in FIG. 9 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 902 may receive communications, such as reference signals, control information, data communications, or a combination thereof, from the apparatus 906. The reception component 902 may provide received communications to one or more other components of the apparatus 900. In some aspects, the reception component 902 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 900. In some aspects, the reception component 902 may include one or more antennas, a modem, a demodulator, a MIMO detector, a receive processor, a controller/processor, a memory, or a combination thereof, of the base station described in connection with FIG. 2.

The transmission component 904 may transmit communications, such as reference signals, control information, data communications, or a combination thereof, to the apparatus 906. In some aspects, one or more other components of the apparatus 900 may generate communications and may provide the generated communications to the transmission component 904 for transmission to the apparatus 906. In some aspects, the transmission component 904 may perform signal processing on the generated communications (such as filtering, amplification, modulation, digital-to-analog conversion, multiplexing, interleaving, mapping, or encoding, among other examples), and may transmit the processed signals to the apparatus 906. In some aspects, the transmission component 904 may include one or more antennas, a modem, a modulator, a transmit MIMO processor, a transmit processor, a controller/processor, a memory, or a combination thereof, of the base station described in connection with FIG. 2. In some aspects, the transmission component 904 may be co-located with the reception component 902 in a transceiver.

The configuration component 908 may generate a configuration indicating one or more directions for applying directional DPD. The transmission component 904 may transmit, to a first UE, the configuration indicating the one or more directions for applying directional DPD to mitigate interference in a direction to a second UE. The reception component 902 may receive, from the first UE and via a main uplink beam, a communication based at least in part on the first UE applying the directional DPD according to the configuration.

The transmission component 904 may transmit an indication of a set of averaging weights associated with a combination of DPD coefficients, wherein the set of averaging weights includes one or more first averaging weights associated with one or more first DPD coefficients for a beam associated with the direction to the second UE and one or more second averaging weights associated with one or more second DPD coefficients for the main uplink beam, and wherein the indication is transmitted to cause the first UE to apply the directional DPD based at least in part on applying the set of averaging weights to the combination of DPD coefficients.

The number and arrangement of components shown in FIG. 9 are provided as an example. In practice, there may be additional components, fewer components, different components, or differently arranged components than those shown in FIG. 9. Furthermore, two or more components shown in FIG. 9 may be implemented within a single component, or a single component shown in FIG. 9 may be implemented as multiple, distributed components. Additionally, or alternatively, a set of (one or more) components shown in FIG. 9 may perform one or more functions described as being performed by another set of components shown in FIG. 9.

The following provides an overview of some Aspects of the present disclosure:

Aspect 1: A method of wireless communication performed by a UE, comprising: receiving a configuration indicating one or more directions for applying directional DPD to mitigate interference in a direction to another UE; and transmitting a communication to a wireless node based at least in part on applying the directional DPD according to the configuration.

Aspect 2: The method of Aspect 1, wherein a DPD coefficient selected from a DPD look-up table corresponds to a beam forming steering angle of a particular beam.

Aspect 3: The method of one or more of Aspects 1 and 2, wherein transmitting the communication includes: restricting an EVM of an uplink signal on a main beam to maintain an SINR at the wireless node.

Aspect 4: The method of one or more of Aspects 1 through 3, wherein the directional DPD is applied based at least in part on a combination of DPD coefficients, wherein the combination of DPD coefficients includes one or more first DPD coefficients for a beam associated with the direction to the other UE and one or more second DPD coefficients for a main uplink beam.

Aspect 5: The method of Aspect 4, further comprising: receiving an indication of a set of averaging weights associated with the combination of DPD coefficients, wherein the set of averaging weights includes one or more first averaging weights associated with the one or more first DPD coefficients and one or more second averaging weights associated with the one or more second DPD coefficients, and the directional DPD is applied based at least in part on applying the set of averaging weights to the combination of DPD coefficients.

Aspect 6: The method of Aspect 5, wherein the indication of the set of averaging weights indicates a priority of the beam associated with the direction to the other UE relative to a priority of the main uplink beam.

Aspect 7: The method of Aspect 4, further comprising: receiving an indication of a quantity of the one or more first DPD coefficients to be included in the combination of DPD coefficients and a quantity of the one or more second DPD coefficients to be included in the combination of DPD coefficients.

Aspect 8: The method of Aspect 7, wherein the indication of the quantity of the one or more first DPD coefficients to be included in the combination of DPD coefficients and the quantity of the one or more second DPD coefficients to be included in the combination of DPD coefficients is received via DCI scheduling an uplink transmission on the main uplink beam, a MAC-CE, or an RRC configuration.

Aspect 9: The method of Aspect 7, wherein the quantity of the one or more first DPD coefficients to be included in the combination of DPD coefficients and the quantity of the one or more second DPD coefficients to be included in the combination of DPD coefficients is determined based at least in part on the beam associated with the direction of the other UE and a distance to the other UE.

Aspect 10: The method of Aspect 7, wherein the indication of the quantity of the one or more first DPD coefficients to be included in the combination of DPD coefficients and the quantity of the one or more second DPD coefficients to be included in the combination of DPD coefficients comprises one or more bits indicating a percentage of DPD coefficients of the main uplink beam to be included in the combination of DPD coefficients.

Aspect 11: The method of Aspect 10, wherein the one or more bits indicating the percentage of the DPD coefficients of the main uplink beam to be included in the combination of DPD coefficients includes two bits.

Aspect 12: The method of one or more of Aspects 1 through 11, further comprising: transmitting, via sidelink communication, a reference signal for estimating a set of non-linear model coefficients to the other UE; and receiving feedback indicating end-to-end non-linear model coefficients from the other UE, wherein a set of DPD coefficients is derived based at least in part on the feedback.

Aspect 13: The method of Aspect 12, wherein the set of DPD coefficients minimizes out-of-band emission in the direction to the other UE.

Aspect 14: The method of Aspect 12, wherein the feedback is received via a PSSCH.

Aspect 15: A method of wireless communication performed by a base station, comprising: transmitting, to a first UE, a configuration indicating one or more directions for applying directional DPD to mitigate interference in a direction to a second UE; and receiving, from the first UE and via a main uplink beam, a communication based at least in part on the first UE applying the directional DPD according to the configuration.

Aspect 16: The method of Aspect 15, further comprising: transmitting an indication of a set of averaging weights associated with a combination of DPD coefficients, wherein the set of averaging weights includes one or more first averaging weights associated with one or more first DPD coefficients for a beam associated with the direction to the second UE and one or more second averaging weights associated with one or more second DPD coefficients for the main uplink beam, and wherein the indication is transmitted to cause the first UE to apply the directional DPD based at least in part on applying the set of averaging weights to the combination of DPD coefficients.

Aspect 17: The method of Aspect 16, wherein the indication of the set of averaging weights indicates a priority of the beam associated with the direction to the other UE relative to a priority of the main uplink beam.

Aspect 18: The method of Aspect 16, wherein the indication of the set of averaging weights indicates a quantity of one or more first DPD coefficients to be included in the combination of DPD coefficients and a quantity of one or more second DPD coefficients to be included in the combination of DPD coefficients.

Aspect 19: The method of Aspect 18, wherein the quantity of the one or more first DPD coefficients to be included in the combination of DPD coefficients and the quantity of the one or more second DPD coefficients to be included in the combination of DPD coefficients is determined based at least in part on the beam associated with the direction of the other UE and a distance to the other UE.

Aspect 20: The method of Aspect 18, wherein an indication of the quantity of the one or more first DPD coefficients to be included in the combination of DPD coefficients and the quantity of the one or more second DPD coefficients to be included in the set of DPD coefficients comprises one or more bits indicating a percentage of DPD coefficients of the main uplink beam to be included in the set of DPD coefficients.

Aspect 21: The method of Aspect 20, wherein the one or more bits indicating the percentage of the DPD coefficients of the main uplink beam to be included in the combination of DPD coefficients includes two bits.

Aspect 22: The method of Aspect 16, wherein the indication of the set of averaging weights is transmitted via DCI scheduling an uplink transmission on the main uplink beam, a MAC-CE, or an RRC configuration.

Aspect 23: An apparatus for wireless communication at a device, comprising a processor; memory coupled with the processor; and instructions stored in the memory and executable by the processor to cause the apparatus to perform the method of one or more of Aspects 1 through 14.

Aspect 24: A device for wireless communication, comprising a memory and one or more processors coupled to the memory, the one or more processors configured to perform the method of one or more of Aspects 1 through 14.

Aspect 25: An apparatus for wireless communication, comprising at least one means for performing the method of one or more of Aspects 1 through 14.

Aspect 26: A non-transitory computer-readable medium storing code for wireless communication, the code comprising instructions executable by a processor to perform the method of one or more of Aspects 1 through 14.

Aspect 27: A non-transitory computer-readable medium storing a set of instructions for wireless communication, the set of instructions comprising one or more instructions that, when executed by one or more processors of a device, cause the device to perform the method of one or more of Aspects 1 through 14.

Aspect 28: An apparatus for wireless communication at a device, comprising a processor; memory coupled with the processor; and instructions stored in the memory and executable by the processor to cause the apparatus to perform the method of one or more of Aspects 15 through 22.

Aspect 29: A device for wireless communication, comprising a memory and one or more processors coupled to the memory, the one or more processors configured to perform the method of one or more of Aspects 15 through 22.

Aspect 30: An apparatus for wireless communication, comprising at least one means for performing the method of one or more of Aspects 15 through 22.

Aspect 31: A non-transitory computer-readable medium storing code for wireless communication, the code comprising instructions executable by a processor to perform the method of one or more of Aspects 15 through 22.

Aspect 32: A non-transitory computer-readable medium storing a set of instructions for wireless communication, the set of instructions comprising one or more instructions that, when executed by one or more processors of a device, cause the device to perform the method of one or more of Aspects 15 through 22.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a "processor" is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods are described herein without reference to specific software code, since those skilled in the art will understand that software and hardware can be designed to implement the systems and/or methods based, at least in part, on the description herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. Many of these features may be combined in ways not specifically recited in the claims and/or disclosed in the specification. The disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A first user equipment (UE) for wireless communication, comprising:
one or more memories; and
one or more processors, coupled to the one or more memories, individually or collectively configured to:
receive a configuration indicating one or more directions for applying directional digital pre-distortion (DPD) for a particular beam of the first UE associated with a direction to a second UE, wherein the configuration further indicates a quantity of DPD coefficients included in a set of DPD coefficients;
transmit an indication of a quantity of non-linear kernels to be used in estimating the set of DPD coefficients;
receive, via a sidelink data channel, feedback from the second UE, wherein the feedback is based at least in part on the quantity of non-linear kernels; and
transmit a communication to a wireless node based at least in part on applying the directional DPD according to the feedback received from the second UE, wherein the directional DPD is applied to balance an error vector magnitude (EVM) of an uplink signal on a main uplink beam and out-of-band distortion associated with the particular beam,
wherein the EVM is restricted to maintain a minimum signal to interference plus noise ratio (SINR) corresponding to the wireless node to be less than a threshold, wherein the out-of-band distortion is reduced while maintaining the minimum SINR at the wireless node.

2. The UE of claim 1, wherein the one or more processors, to transmit the communication, are individually or collectively configured to:
transmit the communication to the wireless node according to a DPD coefficient selected from a DPD look-up table, wherein the DPD coefficient corresponds to a beam forming steering angle of the particular beam.

3. The UE of claim 1, wherein the one or more processors, to transmit the communication, are individually or collectively configured to:
restrict the EVM of the uplink signal on the main uplink beam to maintain the minimum SINR at the wireless node to be less than the threshold.

4. The UE of claim 1, wherein the one or more processors, to transmit the communication, are individually or collectively configured to:
apply the set of DPD coefficients including one or more first DPD coefficients for the particular beam configured to mitigate distortion of a first type, and one or more second DPD coefficients for a main uplink beam configured to mitigate distortion of a second type.

5. The UE of claim 4,
wherein the one or more processors, to receive the configuration, are individually or collectively configured to:
receive an indication of a set of averaging weights associated with the set of DPD coefficients, wherein the set of averaging weights includes one or more first averaging weights associated with the one or more first DPD coefficients and one or more second averaging weights associated with the one or more second DPD coefficients, and
wherein the directional DPD is applied based at least in part on applying the set of averaging weights to the set of DPD coefficients.

6. The UE of claim 5, wherein the indication of the set of averaging weights indicates a priority of the particular beam relative to a priority of the main uplink beam.

7. The UE of claim 4, wherein the one or more processors, to receive the configuration, are individually or collectively configured to:
receive an indication of a quantity of the one or more first DPD coefficients to be included in the set of DPD coefficients and a quantity of the one or more second DPD coefficients to be included in the set of DPD coefficients.

8. The UE of claim 7, wherein the indication of the quantity of the one or more first DPD coefficients to be included in the set of DPD coefficients and the quantity of the one or more second DPD coefficients to be included in the set of DPD coefficients is received via downlink control information (DCI) scheduling an uplink transmission on the main uplink beam, a medium access control control element (MAC-CE), or a radio resource control (RRC) configuration.

9. The UE of claim 7, wherein the quantity of the one or more first DPD coefficients to be included in the set of DPD coefficients and the quantity of the one or more second DPD coefficients to be included in the set of DPD coefficients is determined based at least in part on the particular beam and a distance to the second UE.

10. The UE of claim 7, wherein the indication of the quantity of the one or more first DPD coefficients to be included in the set of DPD coefficients and the quantity of the one or more second DPD coefficients to be included in the set of DPD coefficients comprises one or more bits indicating a percentage of DPD coefficients of the main uplink beam to be included in the set of DPD coefficients.

11. The UE of claim 10, wherein the one or more bits indicating the percentage of the DPD coefficients of the main uplink beam to be included in the set of DPD coefficients includes two bits.

12. The UE of claim 1, wherein the one or more processors are individually or collectively further configured to:
  transmit, via sidelink communication, a reference signal for estimating a set of non-linear model coefficients to the second UE; and
  receive the feedback from the second UE, wherein the feedback indicates end-to-end non-linear model coefficients, and wherein the set of DPD coefficients is derived based at least in part on the feedback.

13. The UE of claim 12, wherein the set of DPD coefficients is configured to mitigate inter-UE interference at the second UE.

14. The UE of claim 12, wherein the feedback is received via a physical sidelink shared channel (PSSCH).

15. A method of wireless communication performed by a first user equipment (UE), comprising:
  receiving a configuration indicating one or more directions for applying directional digital pre-distortion (DPD) for a particular beam of the first UE associated with a direction to a second UE, wherein the configuration further indicates a quantity of DPD coefficients included in a set of DPD coefficients;
  transmitting an indication of a quantity of non-linear kernels to be used in estimating the set of DPD coefficients;
  receiving, via a sidelink data channel, feedback from the second UE, wherein the feedback is based at least in part on the quantity of non-linear kernels; and
  transmitting a communication to a wireless node based at least in part on applying the directional DPD according to the feedback received from the second UE, wherein the directional DPD is applied to balance an error vector magnitude (EVM) of an uplink signal on a main uplink beam and out-of-band distortion associated with the particular beam,
    wherein the EVM is restricted to maintain a minimum signal to interference plus noise ratio (SINR) corresponding to the wireless node to be less than a threshold, wherein the out-of-band distortion is reduced while maintaining the minimum SINR at the wireless node.

16. The method of claim 15, wherein transmitting the communication includes:
  transmitting the communication according to a DPD coefficient selected from a DPD look-up table, wherein the DPD coefficient corresponds to a beam forming steering angle of the particular beam.

17. The method of claim 15, wherein transmitting the communication includes:
  restricting the EVM of the uplink signal on the main uplink transmission beam to maintain the minimum SINR at the wireless node to be less than the threshold.

18. The method of claim 15, wherein transmitting the communication comprises:
  applying the set of DPD coefficients including one or more first DPD coefficients for the particular beam configured to mitigate out-of-band distortion associated with the particular beam, and one or more second DPD coefficients for a main uplink beam configured to mitigate in-band distortion associated with the main uplink beam.

19. The method of claim 18,
  wherein receiving the configuration includes:
    receiving an indication of a set of averaging weights associated with the set of DPD coefficients, wherein the set of averaging weights includes one or more first averaging weights associated with the one or more first DPD coefficients and one or more second averaging weights associated with the one or more second DPD coefficients, and
    wherein the directional DPD is applied based at least in part on applying the set of averaging weights to the set of DPD coefficients.

20. The method of claim 15, further comprising:
  transmitting, via sidelink communication, a reference signal for estimating a set of non-linear model coefficients to the second UE; and
  receiving the feedback from the second UE, wherein the feedback indicates end-to-end non-linear model coefficients, and wherein the set of DPD coefficients is derived based at least in part on the feedback.

21. An apparatus for wireless communication, comprising:
  means for receiving a configuration indicating one or more directions for applying directional digital pre-distortion (DPD) for a particular beam of a first user equipment (UE) associated with a direction to a second UE, wherein the configuration further indicates a quantity of DPD coefficients included in a set of DPD coefficients;
  means for transmitting an indication of a quantity of non-linear kernels to be used in estimating the set of DPD coefficients;
  means for receiving, via a sidelink data channel, feedback from the second UE, wherein the feedback is based at least in part on the quantity of non-linear kernels; and
  means for transmitting a communication to a wireless node based at least in part on applying the directional DPD according to the feedback received from the second UE, wherein the directional DPD is applied to balance an error vector magnitude (EVM) of an uplink signal on a main uplink beam and out-of-band distortion associated with the particular beam,
    wherein the EVM is restricted to maintain a minimum signal to interference plus noise ratio (SINR) corresponding to the wireless node to be less than a threshold, wherein the out-of-band distortion is reduced while maintaining the minimum SINR at the wireless node.

22. The apparatus of claim 21, further comprising:
  means for applying the set of DPD coefficients including one or more first DPD coefficients for the particular beam configured to mitigate distortion of a first type, and one or more second DPD coefficients for a main uplink beam configured to mitigate distortion of a second type.

23. The apparatus of claim 21, further comprising:
  means for transmitting, via sidelink communication, a reference signal for estimating a set of non-linear model coefficients to the second UE; and
  means for receiving the feedback from the second UE, wherein the feedback indicates end-to-end non-linear model coefficients, and wherein the set of DPD coefficients is derived based at least in part on the feedback.

24. The apparatus of claim 23, wherein the set of DPD coefficients is configured to mitigate inter-UE interference at the second UE.

25. The apparatus of claim 23, wherein the feedback is received via a physical sidelink channel.

26. A non-transitory computer-readable medium storing a set of instructions for wireless communication, the set of instructions comprising:

one or more instructions that, when executed by one or more processors of a first user equipment (UE), cause the first UE to:

receive a configuration indicating one or more directions for applying directional digital pre-distortion (DPD) for a particular beam of the first UE associated with a direction to a second UE, wherein the configuration further indicates a quantity of DPD coefficients included in a set of DPD coefficients;

transmit an indication of a quantity of non-linear kernels to be used in estimating the set of DPD coefficients;

receive, via a sidelink data channel, feedback from the second UE, wherein the feedback is based at least in part on the quantity of non-linear kernels; and transmit a communication to a wireless node based at least in part on applying the directional DPD according to the feedback received from the second UE, wherein the directional DPD is applied to balance an error vector magnitude (EVM) of an uplink signal on a main uplink beam and out-of-band distortion associated with the particular beam, wherein the EVM is restricted to maintain a minimum signal to interference plus noise ratio (SINR) corresponding to the wireless node to be less than a threshold, wherein the out-of-band distortion is reduced while maintaining the minimum SINR at the wireless node.

27. The non-transitory computer-readable medium of claim 26, wherein the one or more instructions, when executed by the one or more processors of the first UE, further cause the first UE to:

apply the set of DPD coefficients including one or more first DPD coefficients for the particular beam configured to mitigate distortion of a first type, and one or more second DPD coefficients for a main uplink beam configured to mitigate distortion of a second type.

28. The non-transitory computer-readable medium of claim 26, wherein the one or more instructions, when executed by the one or more processors of the first UE, further cause the first UE to:

transmit, via sidelink communication, a reference signal for estimating a set of non-linear model coefficients to the second UE; and receive the feedback from the second UE, wherein the feedback indicates end-to-end non-linear model coefficients, and wherein the set of DPD coefficients is derived based at least in part on the feedback.

29. The non-transitory computer-readable medium of claim 28, wherein the set of DPD coefficients is configured to mitigate inter-UE interference at the second UE.

30. The non-transitory computer-readable medium of claim 28, wherein the feedback is received via a physical sidelink channel.

* * * * *